(12) United States Patent
Lee

(10) Patent No.: US 12,104,964 B2
(45) Date of Patent: *Oct. 1, 2024

(54) SENSOR PACKAGE AND SENSOR PACKAGE MODULE INCLUDING THE SAME

(71) Applicant: HAESUNG DS CO., LTD., Changwon-si (KR)

(72) Inventor: Jin Woo Lee, Seoul (KR)

(73) Assignee: HAESUNG DS CO., LTD., Changwon-si (KR)

( * ) Notice: Subject to any disclaimer, the term of this patent is extended or adjusted under 35 U.S.C. 154(b) by 345 days.

This patent is subject to a terminal disclaimer.

(21) Appl. No.: 17/531,570

(22) Filed: Nov. 19, 2021

(65) Prior Publication Data

US 2022/0082454 A1 Mar. 17, 2022

Related U.S. Application Data

(62) Division of application No. 16/183,503, filed on Nov. 7, 2018, now Pat. No. 11,209,323.

(30) Foreign Application Priority Data

May 2, 2018 (KR) .......................... 10-2018-0050679

(51) Int. Cl.
*H01L 23/49* (2006.01)
*G01K 1/08* (2021.01)
(Continued)

(52) U.S. Cl.
CPC .............. *G01K 11/265* (2013.01); *G01K 1/08* (2013.01); *H01L 23/48* (2013.01); *H10N 30/8542* (2023.02)

(58) Field of Classification Search
CPC ....................................................... H01L 23/48
See application file for complete search history.

(56) References Cited

U.S. PATENT DOCUMENTS 8,384,486 B2 * 2/2013 Nishio ...................... H03B 1/02
331/107 A
8,860,516 B2 * 10/2014 Nishio ...................... H03B 5/36
331/107 A (Continued)

FOREIGN PATENT DOCUMENTS

JP 5-21452 U 3/1993

OTHER PUBLICATIONS

Office Action dated Mar. 27, 2020 for corresponding Taiwanese Patent Application No. 107139376 including the English Summary of the Office Action.

*Primary Examiner* — Nicholas J Tobergte
(74) *Attorney, Agent, or Firm* — Schwabe Williamson & Wyatt

(57) ABSTRACT

Provided are a sensor package and a sensor package module. The sensor package includes: a substrate including a sensing area; a terminal portion disposed on a side of the sensing area of the substrate and including at least one terminal connected to the outside; a first outer wall disposed on the substrate and including a main wall surrounding at least some outer portions of the sensing area; at least one wire patterned and disposed on the substrate and configured to connect the sensing area and the terminal portion to each other; and a cover disposed on the first outer wall to correspond to the sensing area. Part of the main wall is disposed between the sensing area and the terminal portion, and the main wall includes an opening through which the at least one wire passes.

10 Claims, 8 Drawing Sheets

(51) Int. Cl.
    *G01K 11/26*     (2006.01)
    *H01L 23/48*     (2006.01)
    *H10N 30/853*     (2023.01)

(56)           References Cited

U.S. PATENT DOCUMENTS

| | | | |
|---|---|---|---|
| 11,209,323 | B2* | 12/2021 | Lee .................... G01K 1/08 |
| 2006/0175697 | A1* | 8/2006 | Kurosawa ............ H01L 24/27 |
| | | | 257/E21.705 |
| 2006/0243896 | A1 | 11/2006 | Chen |
| 2007/0075235 | A1 | 4/2007 | Chen |
| 2007/0090380 | A1 | 4/2007 | Hsin |
| 2008/0099866 | A1* | 5/2008 | Chang ............. H01L 27/14685 |
| | | | 257/433 |
| 2009/0053850 | A1* | 2/2009 | Nishida ........... H01L 27/14618 |
| | | | 257/E21.001 |
| 2010/0148341 | A1* | 6/2010 | Fuji .................... H01L 24/11 |
| | | | 257/776 |
| 2010/0164082 | A1* | 7/2010 | Fujisawa ............ H01L 21/568 |
| | | | 257/434 |
| 2013/0209991 | A1 | 8/2013 | Wang et al. |
| 2013/0256814 | A1 | 10/2013 | Tanaka |
| 2015/0371931 | A1* | 12/2015 | Nishida ................ H01L 24/92 |
| | | | 174/255 |
| 2016/0284875 | A1* | 9/2016 | Tsukagoshi ......... H01L 31/186 |
| 2018/0095105 | A1 | 4/2018 | Kawano |
| 2019/0316967 | A1 | 10/2019 | Schieferdecker |

* cited by examiner

SENSOR PACKAGE AND SENSOR PACKAGE MODULE INCLUDING THE SAME

CROSS-REFERENCE TO RELATED APPLICATION

This application is a divisional of U.S. patent application Ser. No. 16/183,503, filed on Nov. 7, 2018, which claims priority to Korean Patent Application No. 10-2018-0050679, filed on May 2, 2018, in the Korean Intellectual Property Office, the disclosure of which are all incorporated by reference herein in their entirety.

BACKGROUND

1. Field

One or more embodiments relate to a sensor package and a sensor package module including the same, and more particularly, to a sensor package using surface acoustic waves and a sensor package module.

2. Description of the Related Art

In general, a sensor chip 10, in which space above a sensor using surface acoustic waves needs securing, may be packaged in ceramics in which a cavity is formed, or as shown in FIG. 1, the sensor chip 10 is mounted on a printed circuit board (PCB) 20, on which cavity walls 30 are formed, and then is covered by a cover 40 for packaging. The sensor chip 10 may be bonded to the PCB 20 by wires 50. In this case, since space for wire bonding needs to be secured within a cavity 60, limitations are imposed on the reduction in heights of the cavity walls 30. Moreover, such an existing package structure may be too costly in regard to the formation of the cavity walls 30.

SUMMARY

One or more embodiments include a sensor package and a sensor package module having a reduced size and manufactured with reduced costs.

Additional aspects will be set forth in part in the description which follows and, in part, will be apparent from the description, or may be learned by practice of the presented embodiments.

According to one or more embodiments, a sensor package includes: a substrate including a sensing area; a terminal portion disposed on a side of the sensing area of the substrate and including at least one terminal connected to the outside; a first outer wall disposed on the substrate and including a main wall surrounding at least some outer portions of the sensing area; at least one wire patterned and disposed on the substrate and configured to connect the sensing area and the terminal portion to each other; and a cover disposed on the first outer wall to correspond to the sensing area. Part of the main wall is disposed between the sensing area and the terminal portion, and the main wall includes an opening through which the at least one wire passes.

The at least one wire may be provided in plural, and the first outer wall may further include at least one first division wall disposed between some of a plurality of wires.

The at least one first division wall may be provided in plural, and at least one of the plurality of the wires may pass between a plurality of first division walls.

The sensor package may further include a second outer wall surrounding the first outer wall outside the first outer wall and including a plurality of second division walls being apart from each other. Part of the second outer wall may be disposed between the sensing area and the terminal portion.

The sensor package may further include a third outer wall surrounding the second outer wall outside the second outer wall and including a plurality of third division walls being apart from each other, A height of the first outer wall from an upper surface of the substrate may be equal to a height of the at least one terminal from the upper surface of the substrate.

The sensor package may further include an adhesive layer disposed between the first outer wall and the cover.

The substrate may include a piezo electric material, and the sensing area may include a first sensing area including: a first input electrode and a first output electrode which are apart from each other with a first delay gap between the first input electrode and the first output electrode; and a sensing film overlapping the first delay gap and covering at least some portions of the first input electrode and the first output electrode.

The sensing area may further include a temperature sensing area, and the temperature sensing area may include a second input electrode and a second output electrode which are apart from each other with a second delay gap between the second input electrode and the second output electrode, the second delay gap being exposed to air.

A first metal layer and a second metal layer may be stacked in the first outer wall, and the first metal layer may include the same material at the same level as the at least one wire.

A first terminal layer and a second terminal layer may be stacked in the at least one terminal, the first terminal layer may include the same material at the same level as the first metal layer, and the second terminal layer may include the same material at the same level as the second terminal layer.

According to one or more embodiments, a sensor package module includes: a circuit board; a sensor package mounted on the circuit board and including a substrate, at least one terminal being on a side of the substrate, and a cover exposing the at least one terminal; at least one bonding pad formed on a side of the circuit board; a wire configured to connect the at least one terminal and the at least one bonding pad; and a molding portion configured to mold the at least one terminal, the at least one bonding pad, and the wire.

The sensor package may include: a first outer wall surrounding at least some portions of a sensing area of the substrate; and at least one wire patterned and disposed on the substrate and configured to connect the sensing area and the at least one terminal. The first outer wall may include a main wall and a first division wall which are apart from each other, and the first division wall may be disposed between the at least one wire.

The sensor package may further include a second outer wall surrounding the first outer wall, and the second outer wall may include a plurality of second division walls that are apart from one other.

The sensor package may further include an adhesive layer disposed on upper surfaces of the first and second outer walls and between the first and second outer walls.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
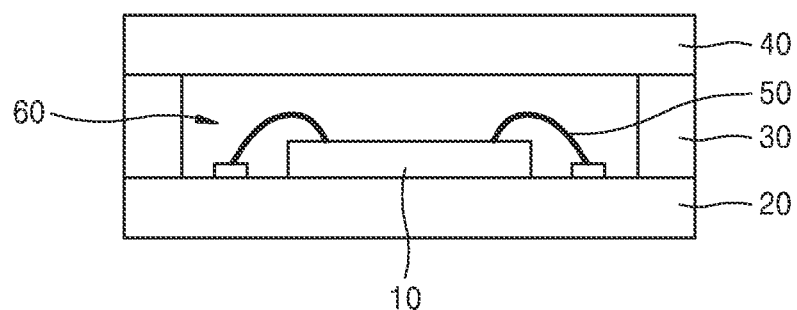
FIG. 1 is a schematic cross-sectional view of an example of a sensor package according to the related art.

As the disclosure allows for various changes and numerous embodiments, particular embodiments will be illustrated in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein. As used herein, the term "and/or" includes any and all combinations of one or more of the associated listed items. Expressions such as "at least one of", when preceding a list of elements, modify the entire list of elements and do not modify the individual elements of the list.

Hereinafter, the present disclosure will be described in detail by explaining embodiments of the disclosure with reference to the attached drawings. Like reference numerals in the drawings denote like elements, and thus their description will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

It will be understood that when a layer, region, or component is referred to as being "connected to" another layer, region, or component, it can be directly on the other layer, region, or component or intervening layers, regions, or components may be present therebetween. In the present specification, for example, when a layer, region, or component is referred to as being electrically connected to another layer, region, or component directly or indirectly.

Figure 2:
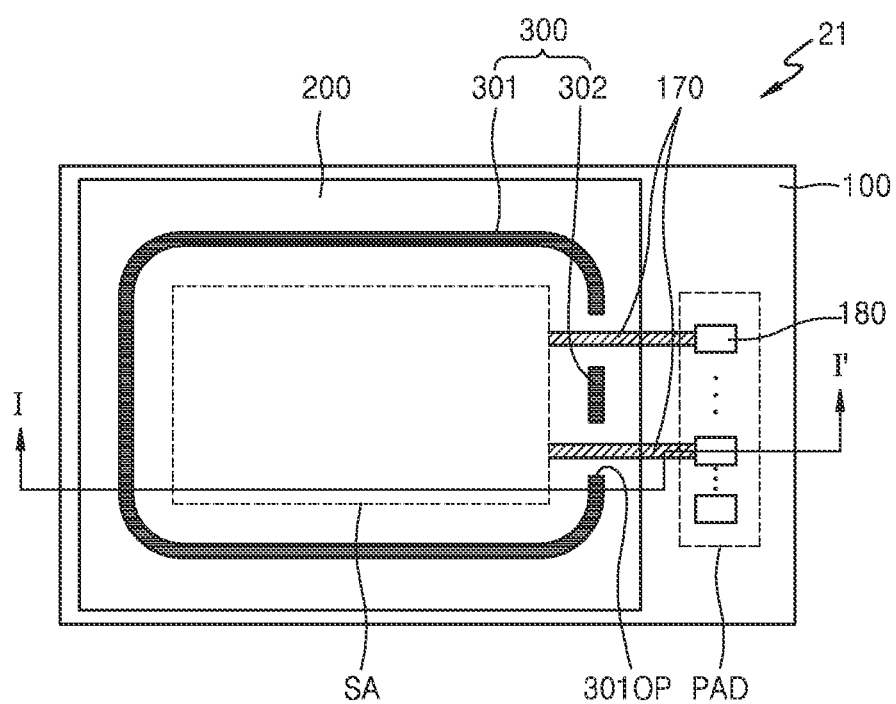
FIG. 2 is a schematic plan view of a sensor package according to an embodiment.
Figure 3:
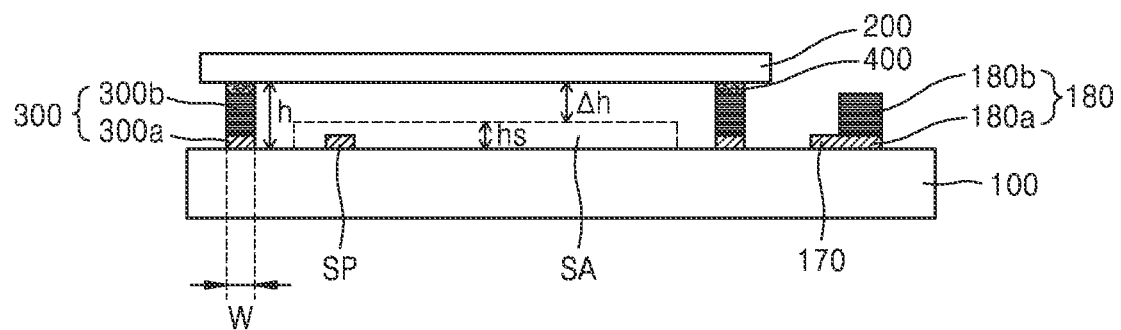
FIG. 3 is a cross-sectional view taken along a line I-I' of FIG. 2.

FIG. 2 is a schematic plan view of a sensor package 21 according to an embodiment. FIG. 3 is a cross-sectional view taken along a line I-I' of FIG. 2.

Referring to FIGS. 2 and 3, the sensor package 21 includes a substrate 100 including a sensing area SA, a terminal portion PAD on the substrate 100, at least one wire 170 connecting the sensing area SA to the terminal portion PAD, and a first outer wall 300 surrounding at least some outer portions of the sensing area SA.

The substrate 100 includes the sensing area SA. Here, the term "sensing area" indicates an area where a sensor pattern, a sensing film, and/or the like capable of detecting light, temperature, humidity, sound, chemical substances, etc. are placed. In some embodiments, the sensing area uses surface acoustic waves, and the substrate 100 includes a piezo electric material. That is, the substrate 100 includes a piezo electric material capable of generating surface acoustic waves by receiving electrical signals. For example, the substrate 100 may include $LiNbO_3$ (LN), $LiTaO_3$ (LT), or the like. However, the present disclosure is not limited thereto. The substrate 100 may include various materials, for example, an organic material such as glass, silicon, or polyimide.

The terminal portion PAD may be on one side of the sensing area SA. In the drawings, the terminal portion PAD is disposed on only one side of the sensing area SA, but the present disclosure is not limited thereto. For example, the terminal portion PAD may be on both sides of the sensing area SA. The terminal portion PAD includes at least one terminal 180. The at least one terminal 180 may be connected to the outside an external device by wire bonding, etc.

The wire 170 connecting the sensing area SA and the terminal 180 may transmit an external signal to the sensing area SA or a signal detected from the sensing area SA to the outside through the terminal 180.

The first outer wall 300 includes a main wall 301 surrounding at least some of the sensing area SA. Part of the main wall 301 is disposed between the sensing area SA and the terminal portion PAD, and the main wall 301 includes an opening 301OP through which at least one wire 170 passes. In other words, the main wall 301 includes end portions arranged to face each other with the at least one wire 170 therebetween. The main wall 301 may continuously surround three faces of the sensing area SA.

The first outer wall 300 may further include a division wall 302 disposed within the opening 301OP or between the end portions. The division wall 302 may be apart from the main wall 301, and at least one wire 170 may be disposed in a gap between the division wall 302 and the main wall 301. Since the division wall 302 is disposed between the sensing area SA and the terminal portion PAD, the division wall 302 may prevent reflective waves from reaching the terminal portion PAD, the reflective waves being generated in the sensing area SA and functioning as noise.

On the first outer wall 300, a cover 200 may be disposed to correspond to the sensing area SA. The cover 200 is to protect the sensing area SA and may include glass, metal, polymers, etc. Depending on types of the sensing area SA, various changes such as partial removal of the cover 200, or a mesh structure may be made to the cover 200. When the sensing area SA detects light, the cover 200 may have a transparent material and may include optical filters, and the like. Alternatively, when the sensing area SA detects chemical substances, moisture, or the like, the cover 200 may have a membrane structure to allow only certain chemical substances, moisture, or the like to pass through the cover 200, or other changes may be made thereto.

An adhesive layer 400 may be disposed between the first outer wall 300 and the cover 200. The adhesive layer 400 is to attach the first outer wall 300 and the cover 200 to each other and may include an adhesive including non-conductive materials. As the adhesive layer 400 includes non-conductive materials, short, which may be caused between the wires 170, etc. and the first outer wall 300, may be prevented.

In the present embodiment, a height h of a cavity including the first outer wall 300, the substrate 100, and the cover 200, that is, the height h from an upper surface of the substrate 100 to a lower surface of the cover 200, may be less than or equal to 1 um. In the present embodiment, since the terminal portion PAD, on which wire bonding, etc. is performed, is not surrounded by the first outer wall 300 and is not covered by the cover 200, the inside of the cavity may be designed without space for wire bonding.

Accordingly, it is enough for the cavity to have a height at which an upper surface of the sensing area SA is not affected by the cover 200. In some embodiments, a height Δh from the upper surface of the sensing area SA to the lower surface of the cover 200 may be between about 500 Å and about 3000 Å (0.05 um to 0.3 um). A height hs of the sensing area SA may be between about 100 Å and about 3000 Å, and thus, the height h of the cavity may be less than or equal to 1 um, for example, between about 0.1 um and about 0.6 um.

A width W of the first outer wall 300 is great enough to support the cover 200 and may be between about 50 um to about 200 um. When the width W of the first outer wall 300 is less than 50 um, the strength of the first outer wall 300 may not be sufficient enough to support the cover 200, and when the width W of the first outer wall 300 is greater than 200 um, a size of the first outer wall 300 may be too great.

The first outer wall 300 may include various materials such as organic materials or inorganic materials. In some embodiments, the first outer wall 300 may include metal. In this case, the first outer wall 300 may include the same material as the wire 170. In addition, the first outer wall 300 may have a single-layer structure or multilayer structure. In some embodiments, the first outer wall 300 may have a structure in which a first metal layer 300a and a second metal layer 300b are stacked. In this case, the first metal layer 300a may include the same material at the same level as the wire 170 and a sensor pattern SP that may be disposed in the sensing area SA. The second metal layer 300b may be on the first metal layer 300a and may include the same material as the terminal 180.

The terminal 180 may have a structure in which a first terminal layer 180a and a second terminal layer 180b are stacked. In this case, the first terminal layer 180a may include the same material at the same level as the first metal layer 300a, and the second terminal layer 180b may include the same material at the same level as the second metal layer 300b. The first terminal layer 180a and the second terminal layer 180b may include various metallic materials such as copper (Cu), aluminum (Al), silver (Ag), gold (Au), and molybdenum (Mo).

Figure 4:
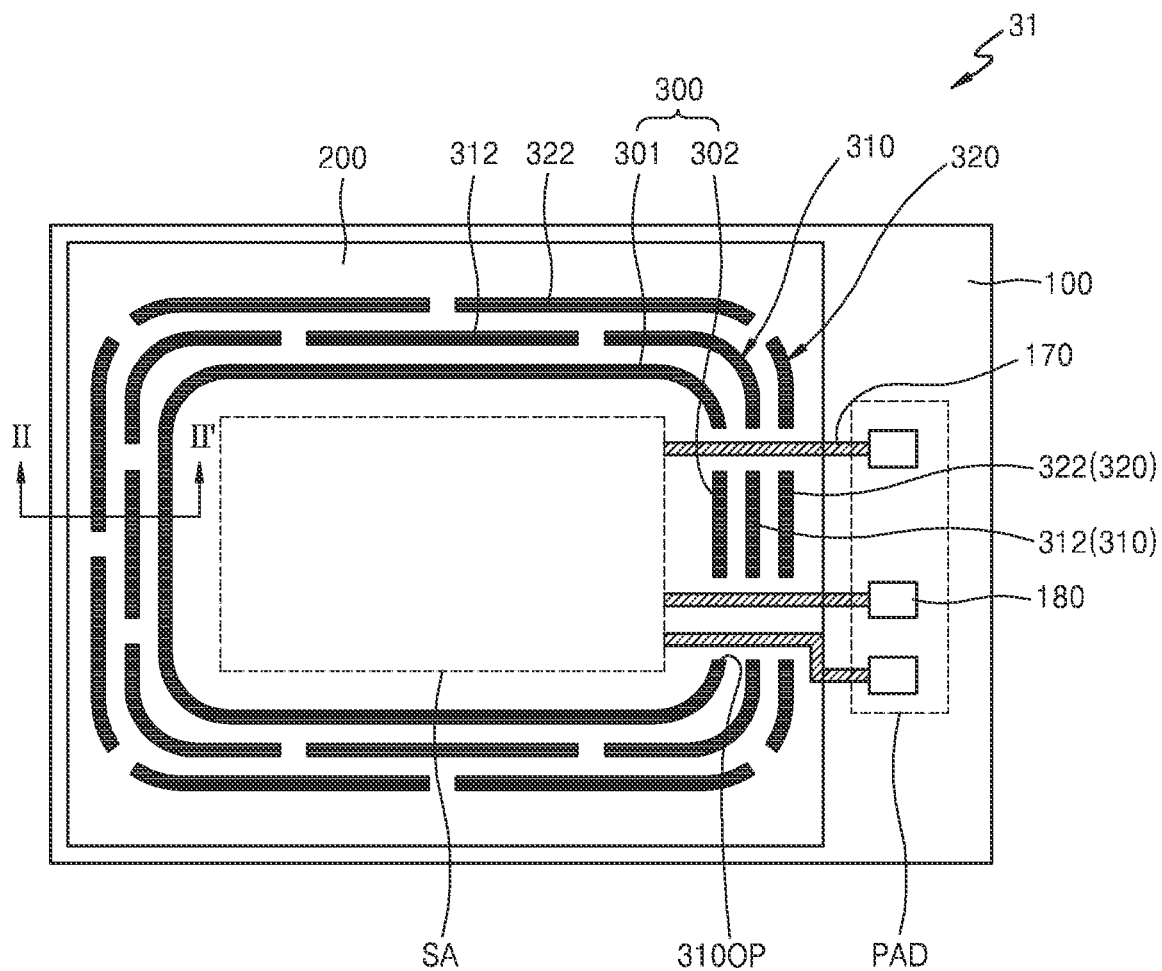
FIG. 4 is a schematic plan view of a sensor package according to another embodiment.
Figure 5A:
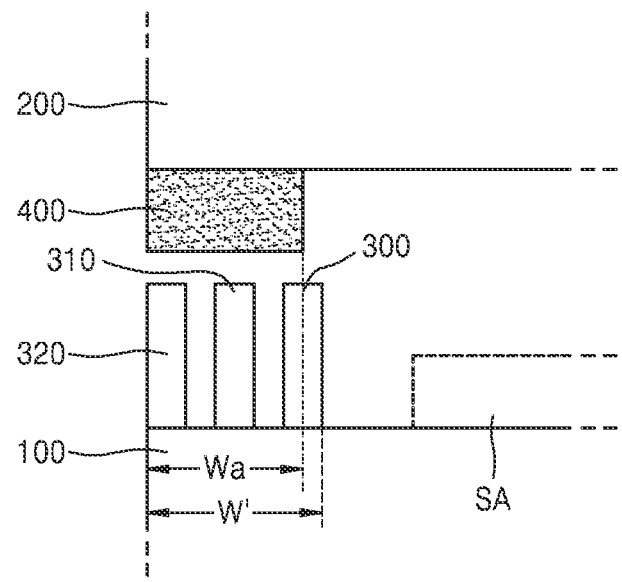
FIGS. 5A and 5B are cross-sectional views for explaining processes of forming a portion taken along a line II-II' of FIG. 4.
Figure 5B:
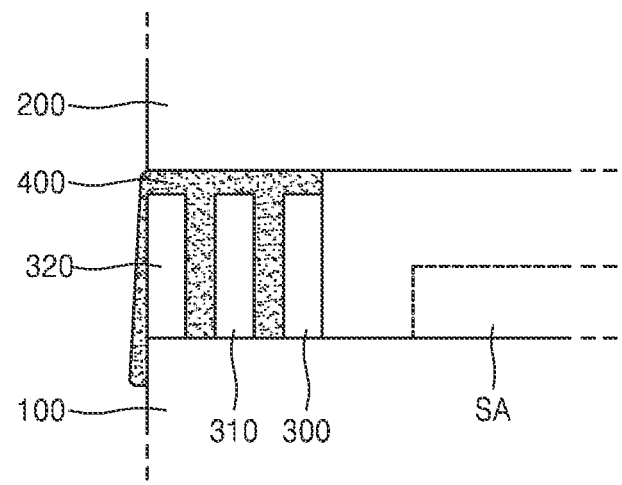

FIG. 4 is a schematic plan view of a sensor package 31 according to another embodiment. FIGS. 5A and 5B are cross-sectional views for explaining processes of forming a portion taken along a line II-II' of FIG. 4. Like reference numerals in FIGS. 3 and 4 denote like elements, and thus their descriptions will be omitted.

Referring to FIG. 4, the sensor package 31 according to the present embodiment includes the substrate 100 including the sensing area SA, the terminal portion PAD including at least one terminal 180 being on the substrate 100 and connected to the outside, the first outer wall 300 surrounding at least some outer portions of the sensing area SA, at least one wire 170 connecting the sensing area SA and the terminal portion PAD to each other, and the cover 200 disposed on the first outer wall 300 to correspond to the sensing area SA. In this case, the first outer wall 300 may include the main wall 301 continuously surrounding three faces of the sensing area SA and the division wall 302 disposed between the sensing area SA and the terminal portion PAD.

The sensor package 31 according to the present embodiment may further include a second outer wall 310 and a third outer wall 320.

The second outer wall 310 may surround the first outer wall 300 outside the same and may include second division walls 312 which are apart from one another. Part of the second outer wall 310 may be disposed between the sensing area SA and the terminal portion PAD. The wires 170 may be disposed in gaps between the second division walls 312 being apart from one another.

The third outer wall 320 may surround the second outer wall 310 outside the same and may include third division walls 322 which are apart from one another. Part of the third outer wall 320 may be disposed between the sensing area SA and the terminal portion PAD. The wires 170 may be disposed in gaps between the third division walls 322 being apart from one another.

The second outer wall 310 and the third outer wall 320 may respectively include the second division walls 312, which are apart from one another, and the third division walls 322, which are apart from one another, and thus, when the cover 200 is attached to the first outer wall 300, second outer wall 310 and the third outer wall 320 by the adhesive layer 400, the second outer wall 310 and the third outer wall 320 may function as paths in which the adhesive layer 400 flows.

Referring to FIGS. 5A and 5B, a width Wa of the adhesive layer 400 may be less than a width W from an inner side of the first outer wall 300 to an outer side of the third outer wall 320. For example, an end portion of the adhesive layer 400 in a direction of the sensing area SA may be formed to the center of a width of the first outer wall 300. Accordingly, when the cover 200 is attached to the first, second, and third outer walls 300, 310, and 320, the adhesive layer 400 may not flow into the sensing area SA, but may flow towards an outer side of the first outer wall 300. In other words, part of a material forming the adhesive layer 400 may not be injected into the sensing area SA, and thus, accurate sensing values may be obtained.

Figure 6:
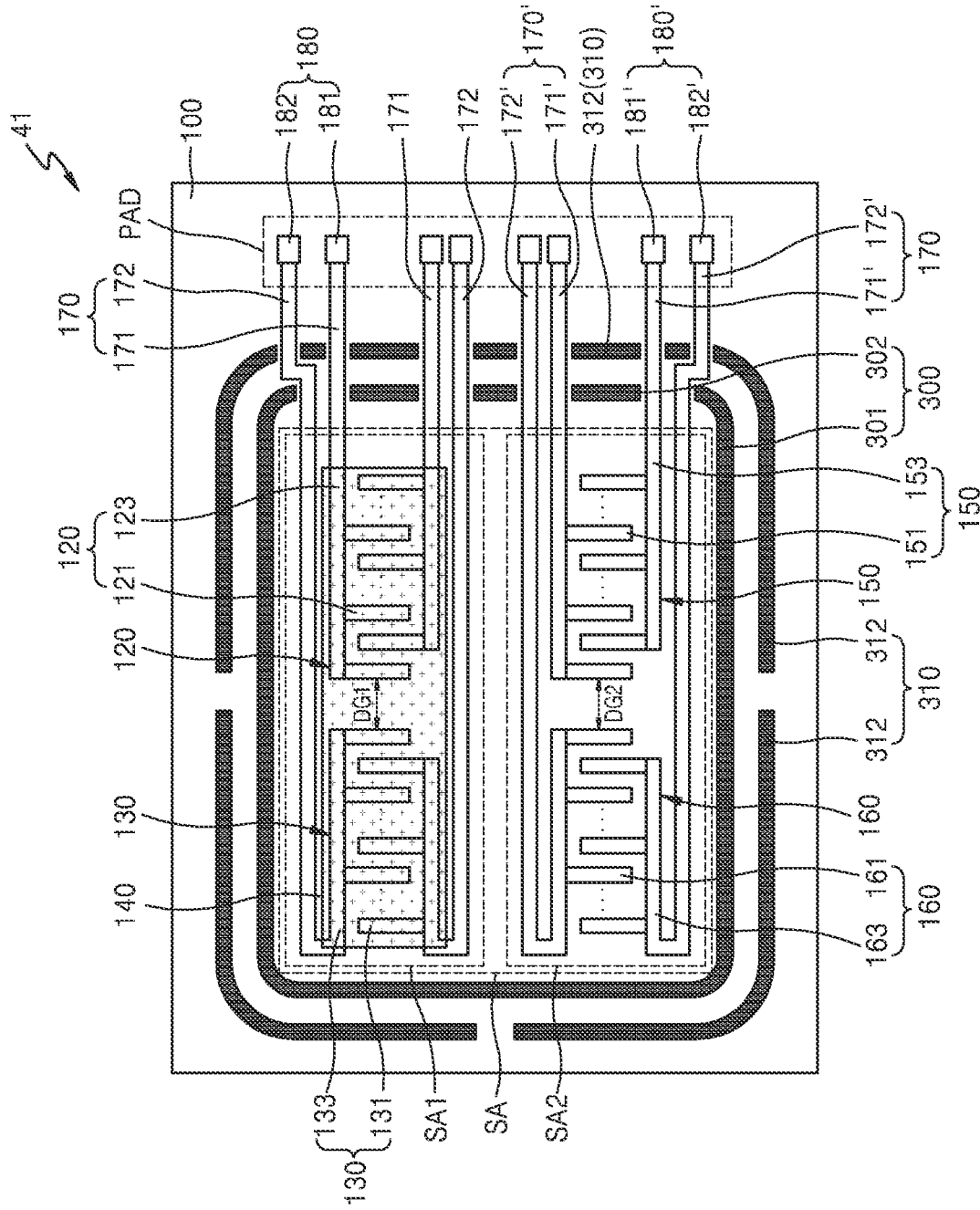
FIG. 6 is a schematic plan view of a sensor package according to another embodiment.
Figure 7:
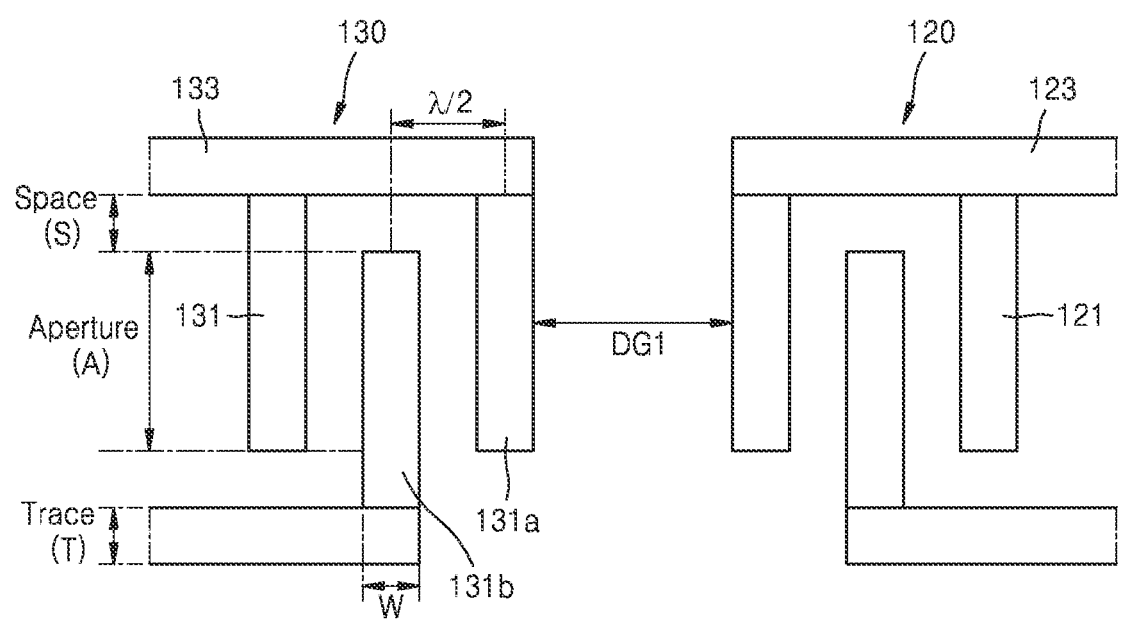
FIG. 7 is a schematic plan view of a portion of a sensing area of FIG. 6.

FIG. 6 is a schematic plan view of a sensor package 41 according to another embodiment. FIG. 7 is a schematic plan view of an enlarged portion of a first sensing area SA1 of FIG. 6. Like reference numerals in FIGS. 3 and 6 denote like elements, and thus their descriptions will be omitted. FIG. 6 does not show the cover 200 of FIG. 3.

Referring to FIG. 6, the sensor package 41 according to the present embodiment includes the substrate 100 including the sensing area SA, the terminal portion PAD including at least one terminal 180 being on the substrate 100 and connected to the outside, the first outer wall 300 surrounding at least some outer portions of the sensing area SA, at least one wire 170 connecting the sensing area SA and the terminal portion PAD to each other, and the cover 200 on the first outer wall 300 to correspond to the sensing area SA. In this case, the first outer wall 300 may include the main wall 301 continuously surrounding three faces of the sensing area SA and the division wall 302 disposed between the sensing area SA and the terminal portion PAD.

Also, the sensor package 41 may be disposed to surround the first outer wall 300 outside the first outer wall 300 and may further include the second outer wall 310 including the second division walls 312 being apart from one another. Part of the second outer wall 310 is disposed between the sensing area SA and the terminal portion PAD.

In the present embodiment, the sensing area SA may include a sensor using surface acoustic waves and may include only one sensing area or multiple sensing areas. In this case, the substrate 100 may include a piezo electric material.

In some embodiments, the sensing area SA may include the first sensing area SA1 and a second sensing area SA2. The first sensing area SA1 may be a light sensing area, and the second sensing area SA2 may be a temperature sensing area where a temperature is measured.

In the first sensing area SA1, a first input electrode 120, a first output electrode 130, and a sensing film 140 are disposed, and in the second sensing area SA2, a second input electrode 150 and a second output electrode 160 are disposed.

The first input electrode 120 and the first output electrode 130 are apart from each other with a first delay gap DG1 therebetween, and the sensing film 140 is disposed by covering at least some portions of the first input electrode 120 and the first output electrode 130. The second input electrode 150 and the second output electrode 160 are apart from each other with a second delay gap DG2 therebetween, and the second delay gap DG2 is exposed to air.

A sensor pattern according to the present embodiment may be able to measure a light amount and a temperature based on a change in acoustic waves. That is, the first input electrode 120 may provide first input acoustic waves to the first sensing area SA1 that is the light sensing area after receiving a first electrical signal, and the first output electrode 130 may output first output acoustic waves that are modulated by the sensing film 140 having properties changing according to external light.

The second input electrode 150 may provide second input acoustic waves to the second sensing area SA2 that is the temperature sensing area after receiving a second electrical signal, and the second output electrode 160 may output second output acoustic waves that are modulated by the substrate 100 having properties changing according to a temperature.

That is, the substrate 100 may include a piezo electric material capable of generating surface acoustic waves in response to electrical signals, and the material of the substrate 100 may be selected from among piezo electric materials and may have properties changing according to the temperature. For example, the substrate 100 may include $LiNbO_3$ (LN) or $LiTaO_3$ (LT). In some embodiments, the substrate 100 may include a piezo electric material of which a conversion rate $K^2$ of converting mechanical energy into electrical energy is at least 5% and a temperature coefficient (TDC) is 50 ppm/° C.

The sensing film 140 includes a material used to detect visible light or ultraviolet rays, and the material may have properties changing in reaction to the visible light or ultraviolet rays. That is, the sensing film 140 may receive light and may change propagation velocity of acoustic waves propagating through the substrate 100.

When the sensing film 140 detects visible light, the sensing film 140 may include CdS or CdSe. The sensing film 140 may be formed by depositing CdS or CdSe, and a thickness of the sensing film 140 may be between about 50 nm and about 300 nm.

When the sensing film 140 detects ultraviolet rays, the sensing film 140 may include zinc oxide (ZnO) or gallium nitride (GaN). In some embodiments, the sensing film 140 may be formed by depositing ZnO, and in this case, the thickness of the sensing film 140 may be between about 50 nm and about 300 nm. In other embodiments, the sensing film 140 may be formed by spin-coating ZnO nano particles. In this case, the thickness of the sensing film 140 may be between about 500 nm and about 1500 nm.

The first input electrode 120 may form an electric field by receiving an external electrical signal, and the substrate 100 may generate surface acoustic waves that are mechanical vibrations by using the electric field. The generated surface acoustic waves are provided to the sensing film 140.

The first output electrode 130 may be apart from the first input electrode 120 with the first delay gap DG1 therebetween and may generate surface acoustic waves, which are changed by the sensing film 140, into electrical signals, thereby outputting the electrical signals. For example, when the sensing film 140 includes ZnO used to detect ultraviolet rays, a center frequency of acoustic waves may move several tens to hundreds KHz to several tens of MHz, according to a detected amount of ultraviolet rays. When the sensing film 140 includes CdS or CdSe used to detect visible light, the center frequency of the acoustic waves may move several tens to hundreds of KHz according to the detected light amount.

The first input electrode 120 and the first output electrode 130 may be Inter Digital Transducer (IDT) electrodes. The IDT electrodes may include a plurality of IDT fingers 121 and 131 having comb shapes and two bar electrodes 123 and 133 respectively connected to the IDT fingers 121 and 131.

The bar electrode 123 of the first input electrode 120 may be connected to input terminals 181 through wires 171, and the bar electrode 133 of the first output electrode 130 may be connected to output terminals 182 through wires 172. Any one of the input terminals 181 and any one of the output terminals 182 may be used as ground electrodes.

The second input electrode 150 may form an electric field by receiving an external electrical signal, and the substrate 100 may generate surface acoustic waves that are mechanical vibrations by using the electric field.

The second output electrode 160 may be apart from the second input electrode 150 with the second delay gap DG2 therebetween and may generate the acoustic waves, which are transmitted along a surface of the substrate 100, into electrical signals, thereby outputting the electrical signals. Since the properties of the substrate 100 may change according to the temperature, properties of the acoustic waves applied to the second output electrode 160 may differ according to the temperature.

The second input electrode 150 and the second output electrode 160 may be IDT electrodes. The IDT electrodes may include a plurality of IDT fingers 151 and 161 having comb shapes and two bar electrodes 153 and 163 respectively connected to the IDT fingers 151 and 161.

The bar electrode 153 of the second input electrode 150 may be connected to input terminals 181' through wires 171', and the bar electrode 163 of the second output electrode 160 may be connected to output terminals 182' through wires 172'. Any one of the input terminals 181' and any one of the output terminals 182' may be used as ground electrodes.

In some embodiments, the first input electrode 120, the first output electrode 130, the second input electrode 150, and the second output electrode 160 may include Al, and thicknesses of the first input electrode 120, the first output electrode 130, the second input electrode 150, and the second output electrode 160 may be between about 100 nm and about 300 nm.

The first input terminals 181, the first output terminals 182, the second input terminals 181', and the second output terminals 182' are aligned on one side of the substrate 100. Lengths of the bar electrode 123 of the first input electrode 120 and the bar electrode 133 of the first output electrode 130 may differ from each other, and lengths of the bar electrode 153 of the second input electrode 150 and the bar electrode 163 of the second output electrode 160 may differ from each other.

In some embodiments, the length of the bar electrode 123 of the first input electrode 120 may be less than that of the bar electrode 133 of the first output electrode 130, and the length of the bar electrode 153 of the second input electrode 150 may be less than that of the bar electrode 163 of the second output electrode 160. Due to the alignment of the terminals, that is, the input terminals 181 and 182 and the output terminals 181' and 182', the entire size of the sensor package 41 may be reduced.

The sensing area SA of the sensor package 41 according to the present embodiment includes the first sensing area SA1 that is the light sensing area and the second sensing area SA2 that is the temperature sensing area, and thus, the light amount and the temperature may be simultaneously measured. The light amount and the temperature may be derived from a difference between center frequencies of the input acoustic waves and the output acoustic waves. In other words, the light amount may be derived from a difference $\Delta fc1$ between a center frequency $fc\_in1$ of first input acoustic waves and a center frequency $fc\_out1$ of first output acoustic waves, and the temperature may be derived from a difference $\Delta fc2$ between a center frequency $fc\_in2$ of second input acoustic waves and a center frequency $fc\_out2$ of second output acoustic waves. Relations or tables of the differences $\Delta fc1$ and $\Delta fc2$ and the light amount and/or the temperature are stored in a central processing unit (CPU) of a controller, etc. that are connected to the sensor package 41, and thus the light amount and the temperature may be derived by measuring the differences $\Delta fc1$ and $\Delta fc2$.

A temperature change of the substrate 100 is reflected to a value of the center frequency $fc\_out1$ of the first output acoustic waves used to measure the light amount, and the second output acoustic waves used to measure the temperature may be used as a reference value with respect to the first output acoustic waves. The center frequency $fc\_out2$ of the second output acoustic waves may be a parameter for measuring the temperature and may also be used as a reference value used to measure the light amount from which temperature properties are excluded.

The sensor package 41 according to the present embodiment is designed to have a tiny size of less than about 2.5 mm×2.5 mm. Also, in order to minimize an integrated circuit (IC) chip, for example, a read out integrated circuit (ROIC), which is connected to the sensor package 41 and detects a frequency change of the acoustic waves, Q values of the acoustic waves obtained from the first sensing area SA1 are set to be greatly high.

To satisfy the conditions, the sensing film 140 that detects the light amount may be disposed to cover the IDT fingers 121 of the first input electrode 120 and the IDT fingers 131 of the first output electrode 130. The purpose of such alignment is to maximally secure a detection area to correspond to a spatial limit of the first sensing area SA1 and restrict at most reflective waves that may be generated due to the reflection. In an embodiment, an area of the sensing film 140 may range from about 0.5 mm$^2$ to about 1.25 mm$^2$.

The center frequency of the acoustic waves that are output from the first sensing area SA1 may be set to be between about 200 MHz and about 300 MHz because, when the center frequency is equal to or greater than 300 MHz, noise increases, and thus a design of the ROIC may become complicated, or a size thereof may increase, and when the center frequency is less than or equal to 200 MHz, sizes of input and output electrodes increase.

When the center frequency of the acoustic waves that are output from the first sensing area SA1 is referred to as a first peak, a value of a Q factor (a bandwidth/center frequency of 3 dB) at the first peak may be great. In this way, frequency sweeping in the ROIC is reduced by reducing a bandwidth of the first peak, and it is easy to identify a change in a first peak value. In some embodiments, the Q factor at the first peak may be between about 200 and about 600, and preferably between about 240 and about 500.

Also, the acoustic waves output from the first sensing area SA1 may have a second peak having a next insertion loss other than the center frequency (the first peak), and thus, a difference between insertion losses of the first and second peaks may be designed to be equal to or greater than 3 dB. As the difference between insertion losses of the first and second peaks increases, the first peak may not be confused with the second peak, and capacity of the ROIC may be reduced.

In the present embodiment, the following design parameters have been secured to ensure that the spatial limit is less than or equal to 2.5 mm×2.5 mm, the difference between the insertion losses of the first and second peaks is equal to or greater than 3 dB, and the Q factor at the first peak is maximized.

First of all, the number of IDT fingers included in each of the first input electrode 120 and the first output electrode 130 may preferably be between about 35 and about 121.

Also, referring to FIG. 7, a distance between a center of one finger 131 and that of an adjacent finger 131 may be adjusted to be about λ/2, and λ/2 may range from about 6.6 um to about 10 um. A width of one of the first finger 131a and the second finger 131b may be between about 3.3 um to and about 4.1 um. The first delay gap DG1 may be between about 15 um and about 600 um. An aperture, which is a length obtained as the first fingers 121 cross and overlap each other, may be between about 300 um and about 650 um.

Figure 8:
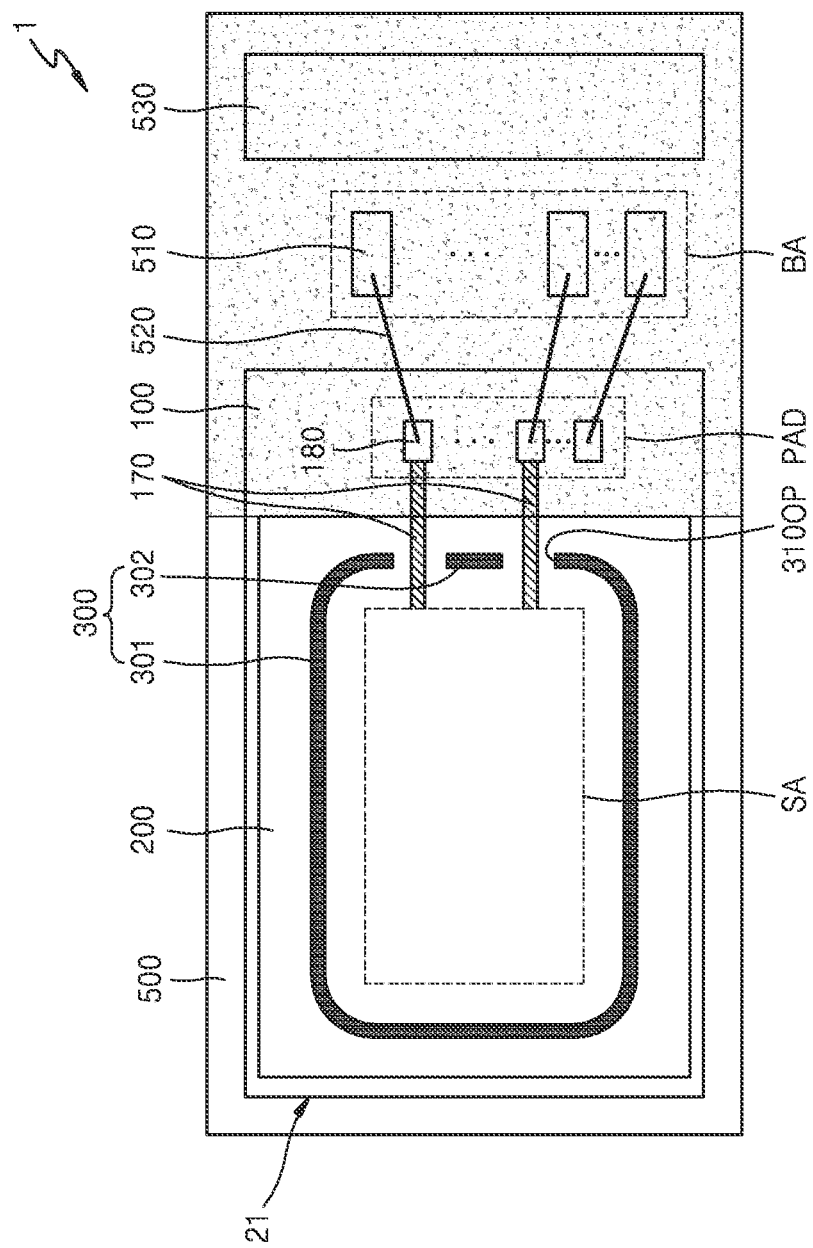
FIG. 8 is a schematic plan view of a sensor package module according to an embodiment.
Figure 9:
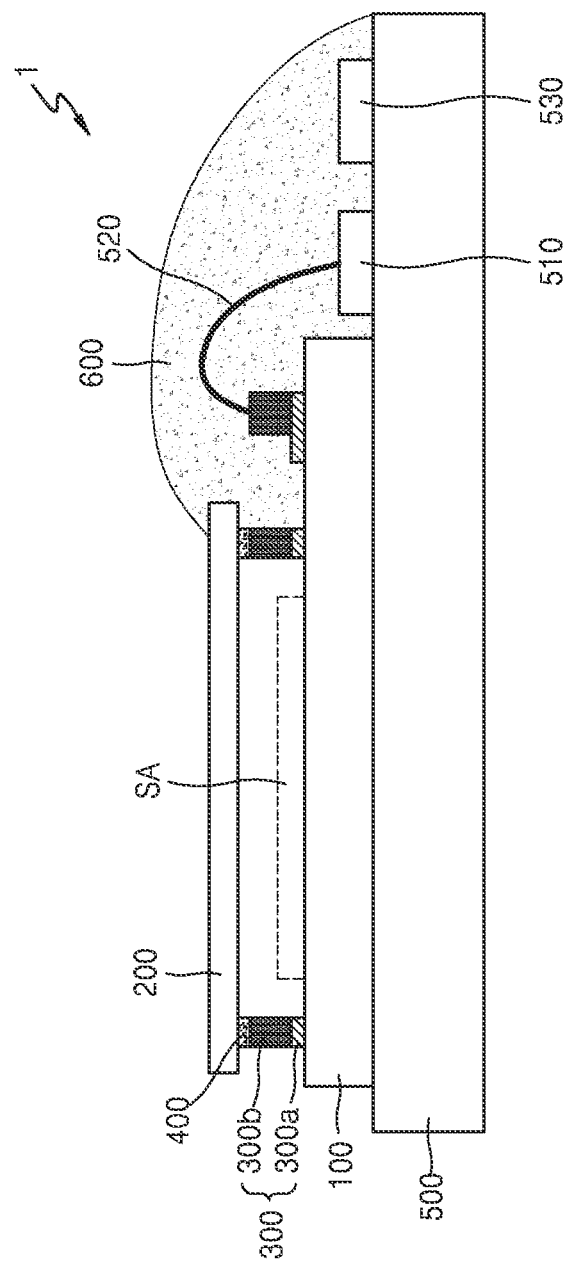
FIG. 9 is a schematic cross-sectional view of the sensor package module of FIG. 8.

FIG. 8 is a schematic plan view of a sensor package module 1 in which the sensor package 21, 31, or 41 according to the embodiments of the present disclosure is mounted on a circuit board 500. FIG. 9 is a schematic cross-sectional view of the sensor package module 1 of FIG. 8.

Referring to FIGS. 8 and 9, the sensor package module 1 includes the circuit board 500, the sensor package 21 mounted on the circuit board 500, and a molding portion 600. In the drawings, the sensor package 21 described with reference to FIG. 2 is mounted. However, the present disclosure is not limited thereto. Various changes may be made to the sensor package module 1, and for example, the sensor package module 1 may include the sensor package 31 of FIG. 4 or the sensor package 41 of FIG. 6.

The circuit board 500 may include a bonding pad area BA on one side thereof. The bonding pad area BA includes multiple bonding pads 510, and the bonding pads 510 may be bonded to the terminals 180 of the sensor package 21 by wires 520.

The circuit board 500 may include a layer or layers, and on or in the circuit board 500, circuit wiring in which the bonding pad area BA is connected to an IC chip 530 may be formed.

Also, the circuit board 500 may include the IC chip 530 on one side thereof. The IC chip 530 may be an ROIC and exchange electrical signals with the sensing area SA. In some embodiments, the IC chip 530 may generate electrical signals to be transmitted to the sensing area SA and may calculate a light amount and a temperature in response to the electrical signals transmitted from the sensing area SA.

The molding portion 600 may simultaneously cover the terminal portion PAD of the sensor package 21, the bonding pad area BA of the circuit board 500, and the IC chip 530. The molding portion 600 may mold the IC chip 530 and the wires 520 to prevent external noise from affecting the IC chip 530 and fix the wires 520. The molding portion 600 may include resin and, in some cases, the molding portion 600 may further include dyes.

Figure 10:
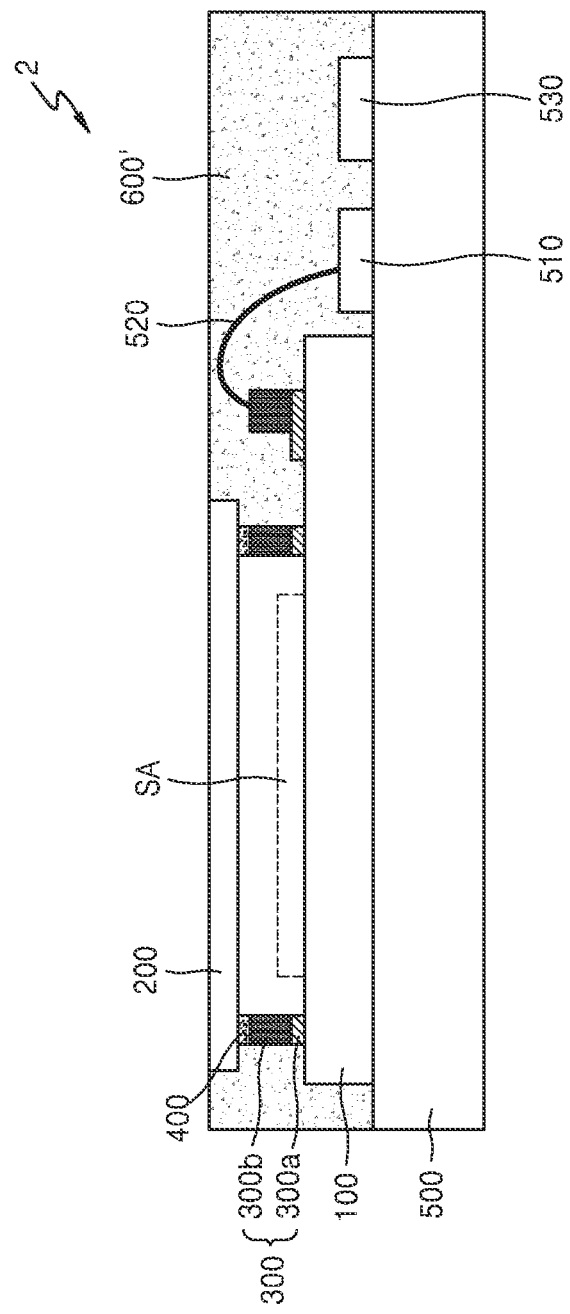
FIG. 10 is a schematic cross-sectional view of a sensor package module according to another embodiment.

FIG. 10 is a schematic cross-sectional view of a sensor package module 2 according to another embodiment.

Referring to FIG. 10, the sensor package module 2 may include the circuit board 500, the sensor package 21 mounted on the circuit board 500, and a molding portion 600'. Referring to FIG. 10, the molding portion 600' may be disposed on both sides of the circuit board 500 instead of being on only one side thereof. Alternatively, the molding portion 600' may surround a perimeter of the sensor package 21 by exposing the entire cover 200 or the center of the cover 200.

In the sensor packages 21, 31, and 41 according to the embodiments, the cover 200 is disposed above the substrate 100 in which the sensor pattern is formed, and the sensor package modules 1 and 2 simultaneously fix portions of the sensor packages 21, 31, and 41 and the circuit board 500 by using the molding portion 600 or 600'. Thus, size reduction may be achieved.

As described above, in a sensor package according to the one or more embodiments, an outer wall supporting a cover is disposed on a substrate in which a sensing area is included, and thus the sensor package may decrease in size. In addition, the outer wall may be formed simultaneously with terminals, and thus, manufacturing processes may be simplified.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A sensor package module comprising:
a circuit board;
a sensor package mounted on the circuit board and comprising a substrate, at least one terminal being on a side of the substrate, and a cover exposing the at least one terminal;
a first outer wall disposed on the substrate and comprising a main wall surrounding at least some portions of a sensing area of the substrate;
at least one wire patterned and disposed on the substrate and configured to connect the sensing area and the at least one terminal;
at least one bonding pad formed on a side of the circuit board;
a wire configured to connect the at least one terminal and the at least one bonding pad; and
a molding portion configured to mold the at least one terminal, the at least one bonding pad, and the wire, wherein:
part of the main wall is disposed between the sensing area and at least one the terminal;
the main wall comprises an opening through which the at least one wire passes;
the main wall includes end portions arranged to face each other with the at least one wire therebetween; and
the opening is located between the end portions.

2. The sensor package module of claim 1,
wherein the at least one wire comprises two adjacent wires, the first outer wall further comprises a first division wall apart from the main wall; and
the first division wall is disposed between the at least two adjacent wires.

3. The sensor package module of claim 2, wherein:
the sensor package further comprises a second outer wall surrounding the first outer wall, and
the second outer wall comprises a plurality of second division walls that are apart from one other.

4. The sensor package module of claim 3, wherein the sensor package further comprises an adhesive layer disposed on upper surfaces of the first and second outer walls and between the first and second outer walls.

5. The sensor package module of claim 3, wherein:
the sensor package further comprises a third outer wall surrounding the second outer wall outside the second outer wall and the third outer wall comprises a plurality of third division walls being apart from each other, and
part of the third outer wall is disposed between the sensing area and the at least one terminal.

6. The sensor package module of claim 1, wherein a height of the first outer wall from an upper surface of the substrate is equal to a height of the at least one terminal from the upper surface of the substrate.

7. The sensor package module of claim 1, wherein:
the substrate comprises a piezo electric material, and
the sensing area comprises a first sensing area comprising:
a first input electrode and a first output electrode which are apart from each other with a first delay gap between the first input electrode and the first output electrode; and
a sensing film overlapping the first delay gap and covering at least some portions of the first input electrode and the first output electrode.

8. The sensor package module of claim 7, wherein:
the sensing area further comprises a temperature sensing area, and
the temperature sensing area comprises a second input electrode and a second output electrode which are apart from each other with a second delay gap between the second input electrode and the second output electrode, the second delay gap being exposed to air.

9. The sensor package module of claim 1, wherein:

a first metal layer and a second metal layer are stacked in the first outer wall, and the first metal layer comprises a same material at a same level as the at least one wire.

10. The sensor package module of claim 9, wherein:

a first terminal layer and a second terminal layer are stacked in the at least one terminal, the first terminal layer comprises the same material at the same level as the first metal layer, and the second terminal layer comprises the same material at the same level as the second terminal layer.

* * * * *